United States Patent
Amiri et al.

(10) Patent No.: US 10,056,903 B2
(45) Date of Patent: Aug. 21, 2018

(54) LOW POWER MULTILEVEL DRIVER

(71) Applicant: Kandou Labs, S.A., Lausanne (CH)

(72) Inventors: Omid Talebi Amiri, Chavannes-pres-Renens (CH); Richard Simpson, Bedford (GB)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/582,550

(22) Filed: Apr. 28, 2017

(65) Prior Publication Data

US 2017/0317675 A1    Nov. 2, 2017

Related U.S. Application Data

(60) Provisional application No. 62/328,722, filed on Apr. 28, 2016.

(51) Int. Cl.
| | | |
|---|---|---|
| H03K 17/16 | (2006.01) | |
| H03K 19/003 | (2006.01) | |
| H03K 19/00 | (2006.01) | |
| H04B 3/04 | (2006.01) | |

(52) U.S. Cl.
CPC ........... *H03K 19/0005* (2013.01); *H04B 3/04* (2013.01)

(58) Field of Classification Search
CPC .............................. H03K 19/0005; H04B 3/04
USPC .......................................................... 326/30
See application file for complete search history.

(56) References Cited

U.S. PATENT DOCUMENTS

| | | |
|---|---|---|
| 668,687 A | 2/1901 | Mayer |
| 780,883 A | 1/1905 | Hinchman |
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara |

(Continued)

FOREIGN PATENT DOCUMENTS

| | | |
|---|---|---|
| CN | 1864346 | 11/2006 |
| CN | 101478286 | 7/2009 |

(Continued)

OTHER PUBLICATIONS

"Introduction to: Analog Computers and the DSPACE System," Course Material ECE 5230 Spring 2008, Utah State University, www.coursehero.com, 12 pages.

(Continued)

*Primary Examiner* — Daniel D Chang
(74) *Attorney, Agent, or Firm* — Invention Mine LLC (57) ABSTRACT

A driver for transmitting multi-level signals on a multi-wire bus is described that includes at least one current source connected to a transmission line, each current source selectively enabled to source current to the transmission line to drive a line voltage above a termination voltage of a termination voltage source connected to the transmission line via a termination impedance element, wherein each of the at least one current sources has an output impedance different than a characteristic impedance of the transmission line, and at least one current sink connected to the transmission line, each current sink selectively enabled to sink current from the transmission line to drive a line voltage below the termination voltage, each of the at least one current sinks having an output impedance different than the characteristic impedance of the transmission line.

16 Claims, 6 Drawing Sheets

(56) References Cited

U.S. PATENT DOCUMENTS

| | | |
|---|---|---|
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray, III |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,991,038 B2 | 1/2006 | Guesnon |
| 6,993,311 B2 | 1/2006 | Li |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Dally |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2* | 8/2010 | Hirose ............ H03K 19/00384 |
| | | 326/83 |
| 7,787,572 B2 | 8/2010 | Scharf |

(56) References Cited

U.S. PATENT DOCUMENTS

| | | |
|---|---|---|
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,649,556 B2 | 2/2014 | Wedge |
| 8,649,840 B2 | 2/2014 | Sheppard, Jr. |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,831,440 B2 | 9/2014 | Yu |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,509,437 B2 | 11/2016 | Shokrollahi |
| 9,544,015 B2 | 1/2017 | Ulrich |
| 9,634,797 B2 | 4/2017 | Benammar |
| 9,667,379 B2 | 5/2017 | Cronie |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2005/0063493 A1 | 3/2005 | Foster |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |

(56) References Cited

U.S. PATENT DOCUMENTS

| | | |
|---|---|---|
| 2005/0220182 A1 | 10/2005 | Kuwata |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0233291 A1 | 10/2006 | Garlepp |
| 2007/0001723 A1 | 1/2007 | Lin |
| 2007/0002954 A1* | 1/2007 | Cornelius ............... H04B 3/04 375/257 |
| 2007/0030796 A1 | 2/2007 | Green |
| 2007/0103338 A1 | 5/2007 | Teo |
| 2007/0121716 A1 | 5/2007 | Nagarajan |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1* | 1/2008 | Mayer ............... G11C 7/1048 326/30 |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0115523 A1 | 5/2009 | Akizuki |
| 2009/0154604 A1 | 6/2009 | Lee |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0235673 A1 | 9/2010 | Abbasfar |
| 2010/0296556 A1 | 11/2010 | Rave |
| 2010/0309964 A1 | 12/2010 | Oh |
| 2011/0014865 A1 | 1/2011 | Seo |
| 2011/0051854 A1 | 3/2011 | Kizer |
| 2011/0072330 A1 | 3/2011 | Kolze |
| 2011/0084737 A1 | 4/2011 | Oh |
| 2011/0103508 A1 | 5/2011 | Mu |
| 2011/0127990 A1 | 6/2011 | Wilson |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2013/0010892 A1 | 1/2013 | Cronie |
| 2013/0013870 A1 | 1/2013 | Cronie |
| 2013/0114519 A1 | 5/2013 | Gaal |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0259113 A1 | 10/2013 | Kumar |
| 2013/0271194 A1 | 10/2013 | Pellerano |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2015/0070201 A1 | 3/2015 | Dedic |
| 2015/0078479 A1 | 3/2015 | Whitby-Strevens |
| 2015/0146771 A1 | 5/2015 | Walter |
| 2015/0222458 A1 | 8/2015 | Hormati |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Design Brief 208 Using the Anadigm Multiplier CAM, Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http://www.retrothing.com/2006/08/classic_analog_.html.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 dated Sep. 22, 2011.

International Search Report and Written Opinion for PCT/EP2011/074219 dated Jul. 4, 2012.

International Search Report and Written Opinion for PCT/EP2012/052767 dated May 11, 2012.

International Search Report and Written Opinion for PCT/US14/052986 dated Nov. 24, 2014.

International Search Report and Written Opinion from PCT/US2014/034220 dated Aug. 21, 2014.

(56) References Cited

OTHER PUBLICATIONS

International Search Report and Written Opinion of the International Searching Authority, dated Jul. 14, 2011 in International Patent Application S.N. PCT/EP2011/002170, 10 pages.
International Search Report and Written Opinion of the International Searching Authority, dated Nov. 5, 2012, in International Patent Application S.N. PCT/EP2012/052767, 7 pages.
International Search Report for PCT/US2014/053563, dated Nov. 11, 2014, 2 pages.
Jiang, A., et al., "Rank Modulation for Flash Memories", IEEE Transactions of Information Theory, Jun. 2006, vol. 55, No. 6, pp. 2659-2673.
Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, dated Jun. 18, 2015, 13 pages.
Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicaciones, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip, IEEE Transactions on Very Large Scale Integration (VLSI) Systems", vol. 15, No. 10 (Oct. 1, 2007), pp. 1091-1100.
Zouhair Ben-Neticha et al, "The streTched—Golay and other codes for high-SNR fnite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.
Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

* cited by examiner

LOW POWER MULTILEVEL DRIVER

CROSS REFERENCE TO RELATED APPLICATIONS

This application claims the benefit of U.S. Provisional Application No. 62/328,722, filed Apr. 28, 2016, entitled "Low Power Multilevel Driver," reference of which is hereby incorporated in its entirety.

REFERENCES

The following prior applications are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter identified as [Cronie I]).

U.S. Pat. No. 9,100,232, issued Aug. 4, 2015, naming Amin Shokrollahi, Ali Hormati, and Roger Ulrich, entitled "Method and Apparatus for Low Power Chip-to-Chip Communications with Constrained ISI Ratio" (hereinafter identified as [Shokrollahi I]);

U.S. patent application Ser. No. 14/315,306, filed Jun. 25, 2014, naming Roger Ulrich, entitled "Multilevel Driver for High Speed Chip-to-Chip Communications" (hereinafter identified as [Ulrich I]).

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives signal or signals approximating those transmitted (as the result of signal degradation over the link, noise, and other distortions.) The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires used for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is 2^8, or 256. As with SES or DS links, output drivers used with a binary vector signaling code need only emit two distinct voltage- or current-levels, corresponding to the two possible coordinate values for each vector element.

With non-binary vector signaling, each component has a coordinate value that is a selection from a set of more than two possible values. A "non-binary vector signaling code" refers to a mapping and/or set of rules to map information bits to non-binary vectors. The corresponding output driver for a non-binary vector signaling code may then be configured to emit multiple voltage- or current-levels corresponding to the selected coordinate values for each vector output. Examples of vector signaling methods are described in [Cronie I].

BRIEF DESCRIPTION

A transmitter and receiver can communicate using a serial communications link, wherein the serial communications link uses signaling based on a balanced vector signaling code. The vector signaling code transmits a vector of symbols using multiple wires of the communications link in each transmit unit interval. The number of components of the vector can be two, three, four, or more than four. The number of coordinate values for a component can be two, three, four, or more than four. For example, a link might use four components with four possible coordinate values: a high value, a low value, and inverses of the high and low values, such that a signal having the high value cancels out three signals having the inverse of the low value and a signal having the inverse of the high value cancels out three signals having the low value and, in this manner, the link can convey three bits in a signal period using those four components by mapping the eight possible three bit combinations onto the eight vector code words represented by the four permutations of one high value and three inverses of the low value plus the four permutations of the inverse of one high value and three low values. In a more specific embodiment, the high and low values are voltage values and relative to a reference, the high value and its inverse have the same magnitude but opposite signs, the low value and its inverse have the same magnitude but opposite signs, and the high value has a magnitude three times the low value. As another example, a different link might use three components chosen from three possible coordinate values: a positive value, a smaller positive value, and a smallest positive value or zero, such that the sum of all vector component values is a constant. Such a code is also balanced, albeit with an additional offset or DC component superimposed upon all possible coordinate values as is common practice in embodiments relying on single-ended power supplies.

In at least one embodiment, a driver for transmitting multi-level signals on a multi-wire bus is described that includes at least one current source connected to a transmission line, each current source selectively enabled to source current to the transmission line to drive a line voltage above a termination voltage of a termination voltage source connected to the transmission line via a termination impedance element, wherein each of the at least one current sources has an output impedance different than a characteristic impedance of the transmission line, and at least one current sink connected to the transmission line, each current sink selectively enabled to sink current from the transmission line to drive a line voltage below the termination voltage, each of the at least one current sinks having an output impedance different than the characteristic impedance of the transmission line.

In some embodiments, the termination impedance is matched to the characteristic impedance of the transmission line. In some embodiments, the apparatus further comprising at least one transmit impedance element connecting at least one current source or at least one current sink to the transmission line. In some embodiments, at least one transmit impedance connects both a current source and a current sink to the transmission line.

In some embodiments, each current source and current sink includes a corresponding switch configured to selectively enable sourcing or sinking of the current to the transmission line. In some embodiments, at least one of the current sources is an active current source connected to the transmission line via the corresponding switch. In some embodiments, at least one current sink is a resistive element connected to the transmission line.

In some embodiments, the transmission line corresponds to a single wire of a multi-wire bus, each wire of the multi-wire bus connected to the termination voltage node by a corresponding termination impedance. In some embodiments, the apparatus further includes a switching circuit connected to a single current source or a current sink, the switching circuit configured to connect the single current source or current sink to one or more of the wires of the multi-wire bus. In some embodiments, the at least one current source and the at least one current sink are configured to collectively form at least three possible line voltage values.

In accordance with at least one embodiment, processes and apparatuses provide for transmitting data over physical channels to provide a high speed, low latency interface providing high total bandwidth at low power utilization, such as to interconnect integrated circuit chips in a multi-chip system. In some embodiments, different voltage, current, etc. levels are used for signaling and more than two levels may be used, such as a quaternary signaling system wherein each wire signal has one of four values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter.

DETAILED DESCRIPTION

Despite the increasing technological ability to integrate entire systems into a single integrated circuit, multiple chip systems and subsystems retain significant advantages. For purposes of description and without limitation, example embodiments described herein assume a systems environment of at least one point-to-point communications interface connecting two integrated circuit chips representing a transmitter and a receiver, wherein the communications interface is supported by at least one interconnection group of more than two high-speed transmission line signal wires providing medium loss connectivity at high speed, a vector signaling code carries information from the transmitter to the receiver as simultaneously transmitted values on each wire of a group with individual values being selected from three or more levels and, the overall group is constrained by the vector signaling code to a fixed sum of levels.

Thus in one embodiment, symbol coordinate values of the H4 vector signaling code first described in [Cronie I] are transmitted as offset voltage levels from a fixed reference, as one example a +200 mV offset representing a "+1", a −66 mV offset representing a "−⅓", etc.

Physical Channel Characteristics

As one example of a high speed communication system, communication elements may be interconnected via a communications channel composed of at least one group of microstripline wires separated by a dielectric layer from a ground plane, providing a controlled impedance multiwire transport suitable for use with a vector signaling code. The multiple wires of the group are routed together with homogenous fabrication characteristics, to minimize variations in attenuation and propagation velocity. Further, each wire in this channel is terminated at each end in its characteristic transmission line impedance. Thus, following conventional good practice for a typical transmission line impedance of 50 ohms, signals are issued by a transmitter having a source impedance of 50 ohms, and are detected at the receiver as voltages across or current through a 50 ohm termination resistance. Current practice supports communication over such channels at rates up to tens of Gigabits per second, over distances ranging from several centimeters to a meter or more.

[Ulrich I] describes line driver embodiments compatible with these conventional channels, providing multiple signal output levels with matched output impedance, and optional Finite Impulse Response waveform shaping. [Shokrollahi I] similarly describes transmitters and receivers capable of communicating at 25 Gigabits per second per communications channel wire, over distances of up to 25 millimeters.

However, applying these practices to shorter channels may result in unnecessary power consumption and system complexity. The short propagation times and minimal transmission line variations seen in an interconnection within a single integrated circuit device may not use perfectly matched terminating impedances to permit error-free communication to occur. Thus, the embodiments described herein offer reduced line driver power consumption in those environments where matched line terminations are not implemented.

For purposes of illustration and without implying limitation, channels associated with subsequent embodiments described herein may be composed of 50 ohm impedance interconnections routed as wire groups of six to eight wires of equal length not exceeding two millimeters (e.g. between to subsystems on a single integrated circuit device, or between two integrated circuits within a multi-chip module,) operating at data rates of up to 25 Gigabits per second per wire using the receivers and vector signaling code described in [Shokrollahi I.]

Low Power Line Driver

Figure 1:
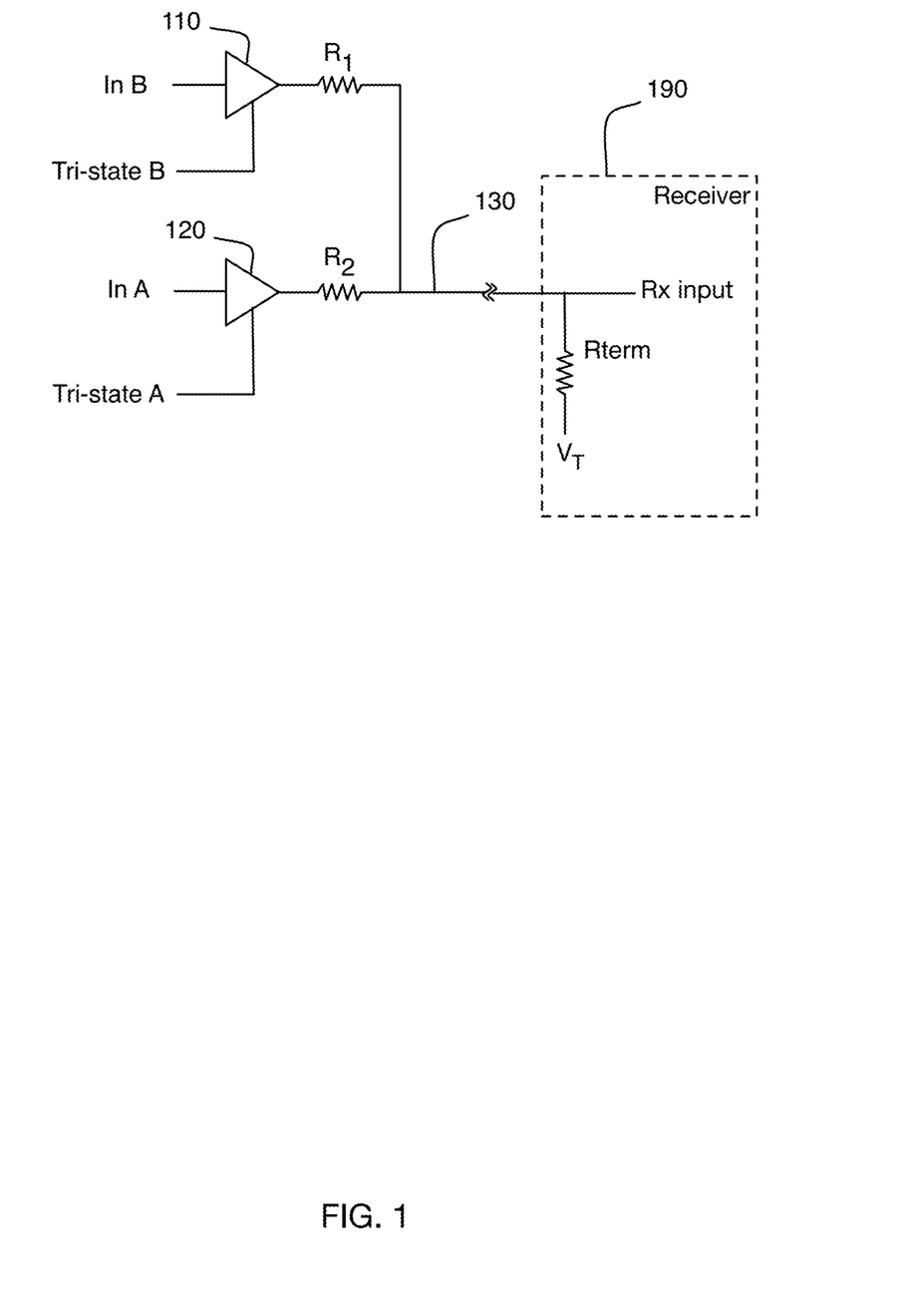
FIG. 1 is a schematic diagram of one embodiment of a multilevel line driver.

A first embodiment of a line driver suitable for generation of up to four discrete output signal levels on a single wire is shown in the schematic of FIG. 1. Output drivers 110 and 120 are conventional CMOS tri-state output devices, e.g. capable of both sourcing and sinking current using a stacked PMOS/NMOS output structure, or presenting a high-impedance output in which neither output transistor is enabled.

Each output level is produced by enabling one output driver and setting its input to either a logic "1" or a logic "0". Series resistors $R_1$ and $R_2$ form a voltage divider with termination resistor $R_{term}$, thus the output levels seen at 130 will be a fraction of the Vdd-to-Vss output voltage swing produced by driver 110 or driver 120 at their outputs. Four output levels are possible: $R_1$ driven high, $R_2$ driven high, $R_2$ driven low, and $R_1$ driven low.

In one embodiment, $R_1$=50 ohms, $R_2$=250 ohms, and $R_{term}$=50 ohms, With Vdd=0.9 volts, output levels of 675, 525, 375, and 225 mV were obtained in that particular embodiment.

Figure 5:
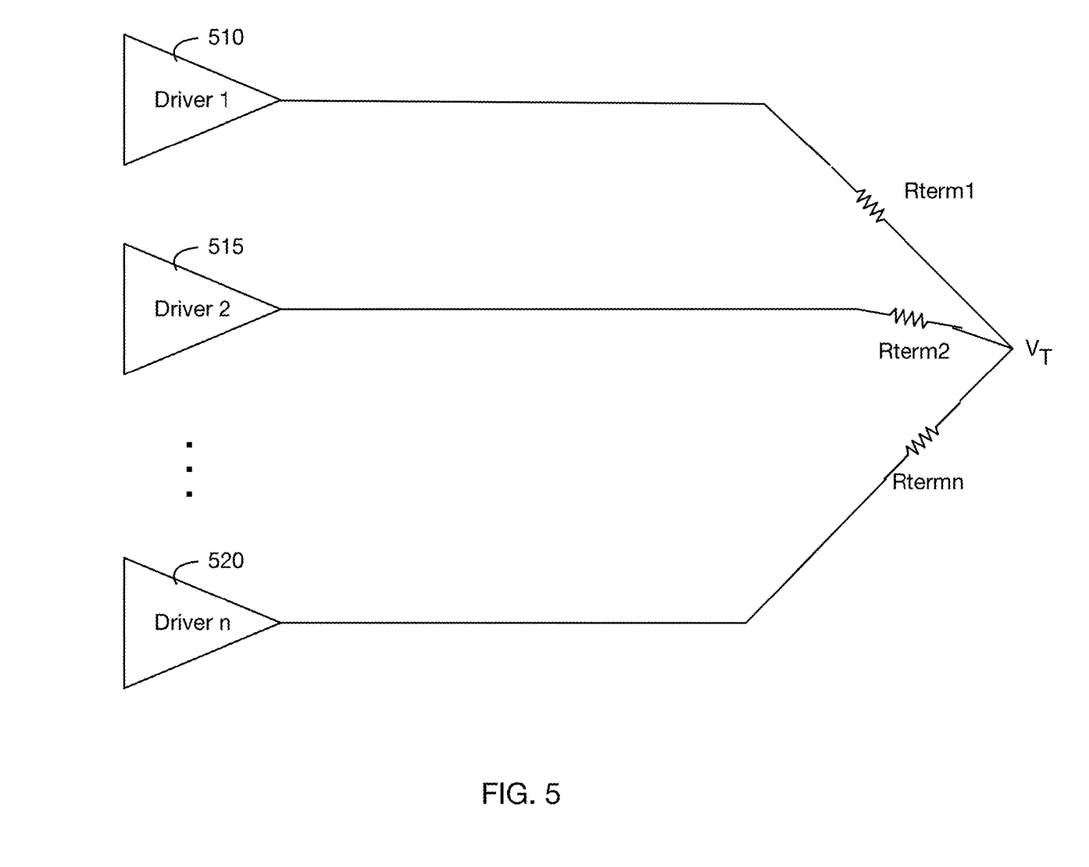
FIG. 5 is a block diagram of a multi-transmission line communication system, in accordance with some embodiments.

Termination voltage $V_T$ represents the mid-point of the transmit output levels and thus the midpoint or bias level for Receiver 190 as well. As the example Glasswing code of [Shokrollahi I] is a balanced six wire code (i.e. all elements of that code summing to a constant value for all codewords,) the six instances of FIG. 1 needed to drive the six wires may be interconnected at node $V_T$, with the termination voltage produced by the passive summation of the currents flowing through each wire's Rterm to the common connection at node $V_T$, with no need for a separate termination voltage source. At least one embodiment provides a bypass capacitor between that common connection node for all termination resistors and ground. FIG. 5 illustrates an exemplary embodiment in which n drivers 510, 515, . . . , 520 are connected to the termination voltage node via corresponding termination impedance elements Rterm1, Rterm2, . . . , Rtermn.

This circuit provides significant power savings over the multilevel output driver of [Ulrich I] but does not provide a constant source impedance facing 130. Thus, there is more risk of signal reflections causing inter-symbol interference, especially if the transmission path round trip time is an appreciable fraction of a transmission unit interval. However, this will rarely be the case for extremely short channels, while the potential power savings will be of significant importance.

Figure 2:
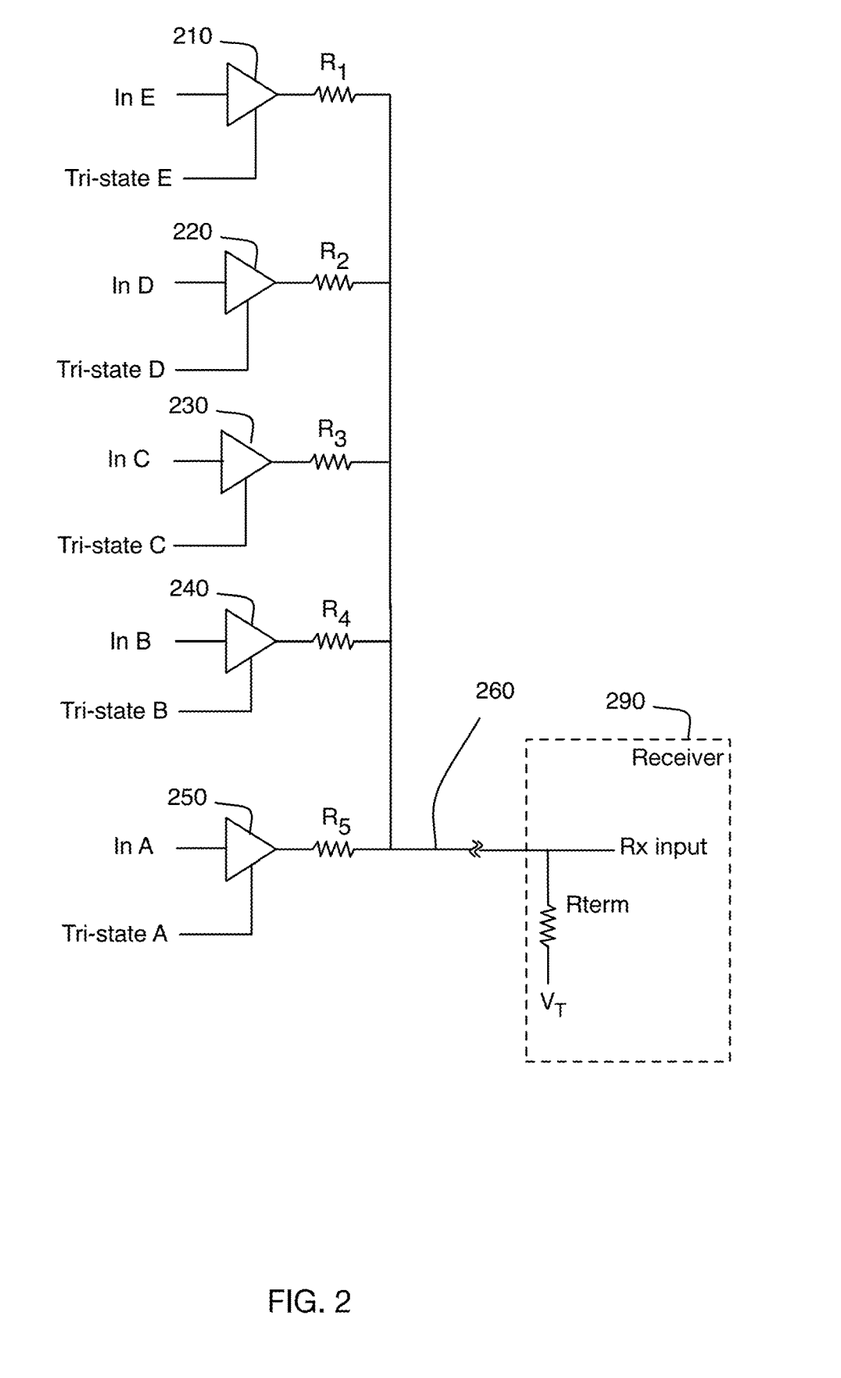
FIG. 2 is a schematic diagram of another embodiment of a multilevel line driver.

Illustrating that this technique is extensible, a further embodiment is shown in the schematic diagram of FIG. 2, with five tri-stateable CMOS buffers 210, 220, 230, 240, 250 with source resistors $R_1$, $R_2$, $R_3$, $R_4$, $R_5$ producing up to ten discrete signal levels at 260 and receiver 290. As will be apparent from the two examples given, additional embodiments may be designed which support different signaling levels, different numbers of signaling levels, and different numbers of wires.

Hybrid Line Driver

Figure 3:
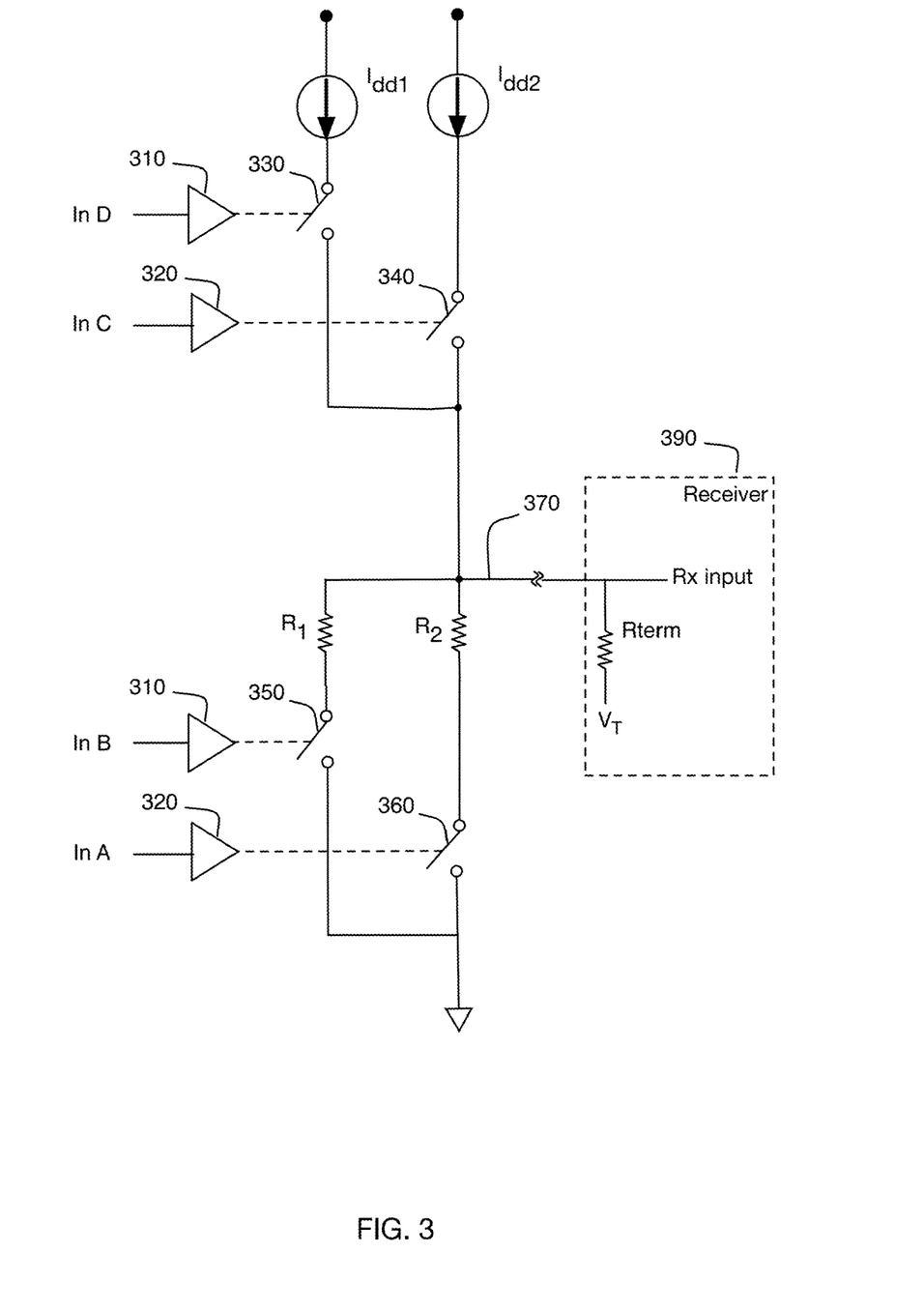
FIG. 3 is a schematic diagram of one embodiment of a multilevel line driver comprising both current source and resistive sink elements.

The line driver embodiment illustrated in the schematic of FIG. 3 may be configured to provide even lower power operation, again provided that the transmit impedance facing the output is not constrained. As with the previous examples, termination voltage $V_T$ represents the mid-point of the multiple transmit signal levels, as well as typically also the receiver bias point. Output voltage levels greater than termination voltage $V_T$ are produced by injecting current into node 370 by asserting InC or InD which in turn closes switch 330 or 340, thus connecting current source Idd1 or Idd2 to 370, with the additional current across Rterm raising the voltage at 370. Output voltage levels less than $V_T$ are produced by removing current from node 370 by asserting InA or InB which in turn closes switch 350 or 360, thus connecting transmit impedance resistors R1 or R2 to 370 and lowering the voltage seen across Rterm and thus by receiver 390. Although active current sinks can be used for current removal, practical design considerations favor the simpler approach of resistive current sinking. While it may be feasible to obtain 16 various voltage levels by selectively enabling and disabling inputs In A/B/C/D, some embodiments may utilize a subset. For example, for the Glasswing encoding scheme referenced below, only 1 input In A/B/C/D may be enabled at a time, producing the 4 possible voltage levels corresponding to symbol values ±1, ±⅓.

In one embodiment, switches 330, 340, 350, 360 are MOS transistors, and termination voltage $V_T$ at the termination voltage node is produced as previously described, by interconnecting each wire instance of FIG. 3 at $V_T$ with an optional bypass capacitor from that interconnection node to ground. In one particular embodiment, $R_1$=100 ohms, $R_2$=0 ohms, and $R_{term}$=50 ohms, with current sources of 3 mA and 1.5 mA. With Vdd=0.9 V, output levels of 450, 300, 150, and 0 mV were obtained in that particular embodiment.

Switched circuit elements are used to pass current from current sources Idd1 and Idd2, because in practice directly enabling/disabling of a current source has been found to be too slow. Such switching also suggests a further optimization. Just as the termination voltage $V_T$ appears as a consensus or aggregate result of the interconnection of all termination resistors from wires carrying a balanced vector signaling code, the characteristics of the code may be used to optimize the design and usage of the current sources Idd1 and Idd2. As one example, [Shokrollahi I] teaches that every Glasswing or 5b6w codeword contains exactly one "+1" symbol, and exactly two "+⅓" symbols. Thus, of the six instances of FIG. 3 (one instance for each of six wires) needed to output that code, only one will use the current source producing the "+1" output level, and exactly two will use the current source producing the "+⅓" level. Because of this consistent usage pattern, another embodiment uses a single "+1" current source across all six instances, and configures the associated selection switches as a "1 of 6" switching circuit, directing that current to the wire requiring that symbol value for the code word being output. Similarly, two current sources may be shared among six wires for the "+⅓" output level. (As an alternative embodiment, a single current source providing twice the current could potentially be shared between the two wires requiring a "+⅓" output, at the risk of uneven current sharing.) With the resistor and current values previously described for the particular embodiment, a total current consumption of 6 mA (one 3 mA current source shared among six wires, and two 1.5 mA current sources shared among six wires) will support an entire 5b6w interface. Similar optimizations may be obtained for other vector signaling codes.

Figure 4:
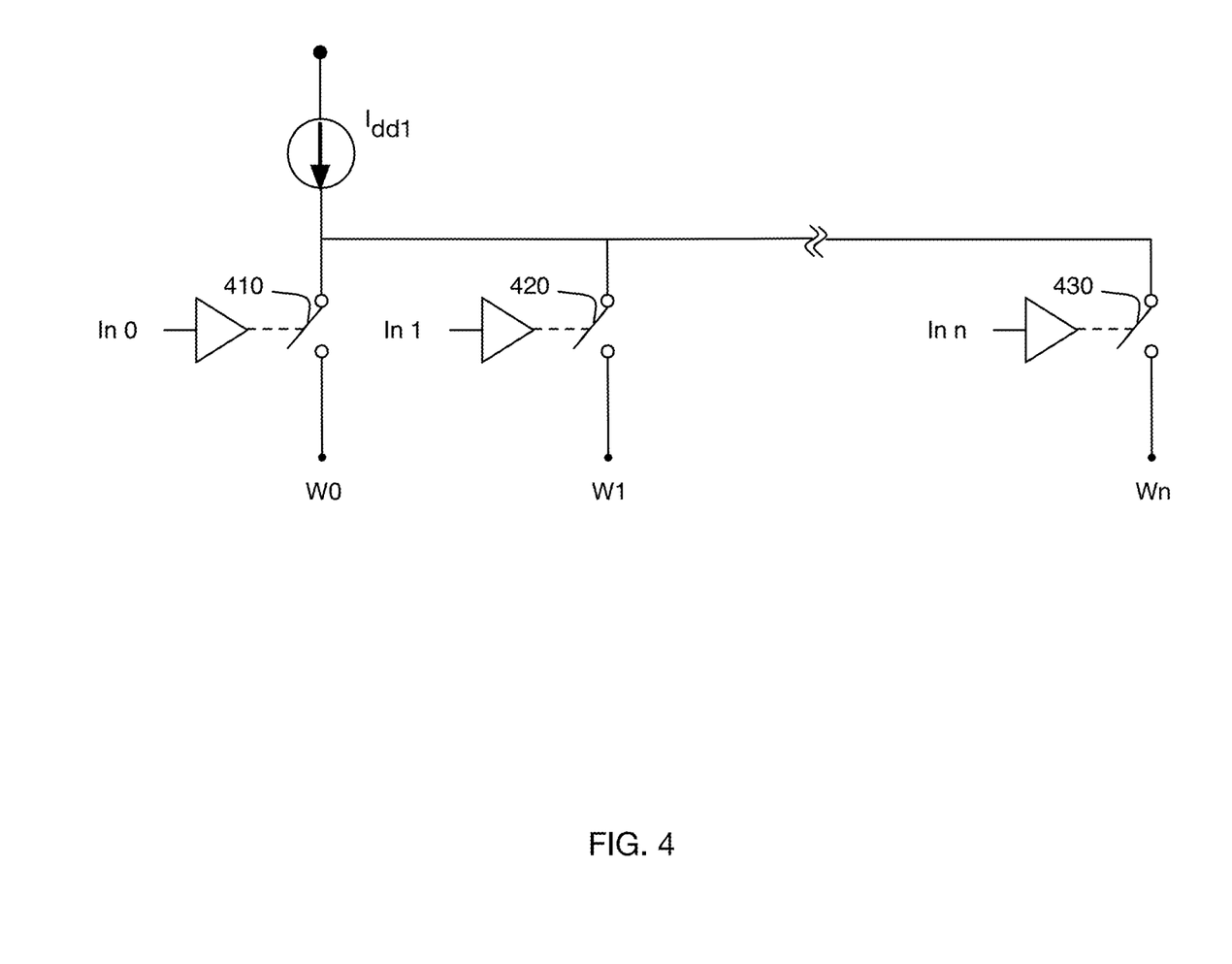
FIG. 4 is a switching circuit, in accordance with some embodiments.

FIG. 4 is a schematic of a switching circuit configured to direct the current of Idd1 to one of a plurality wires of the multi-wire bus. As shown, current source Idd1 is connect to n switches, each switch connected to a respective wire of the multi-wire bus. In the embodiment above where Idd1 corresponds to a "+1" symbol, only one of the switches 410/420/430 may be enabled at a given time. A similar circuit may be used for the current source corresponding to the "+⅓" symbol, as well as the current sinks corresponding to the "−1" and "−⅓" symbols. Alternatively, current source Idd1 may correspond to a value of "+⅔", and may be simultaneously connected to two wires, providing each wire with a level of "+⅓".

Figure 6:
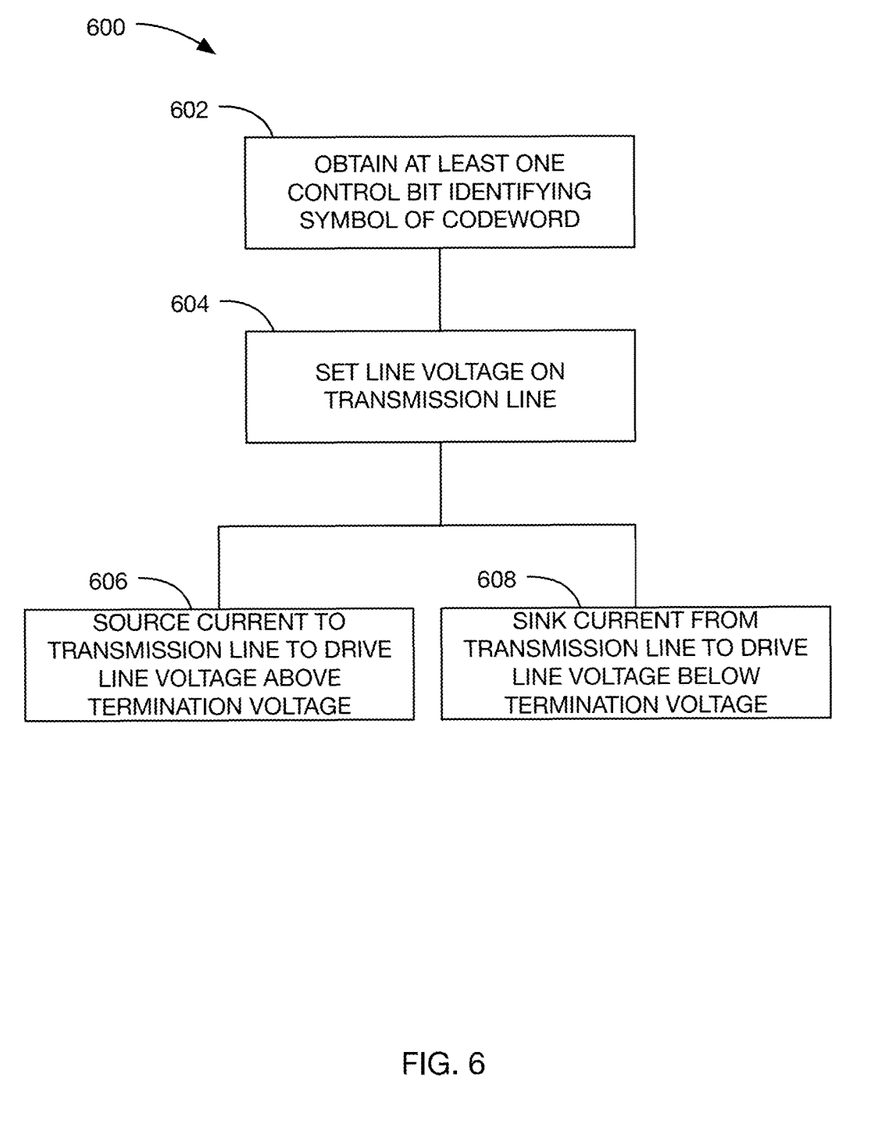
FIG. 6 is a flowchart of a method, in accordance with some embodiments.

FIG. 6 is a flowchart of a method 600, in accordance with some embodiments. As shown, FIG. 6 includes obtaining 602 at least one control bit identifying a symbol of a codeword of a vector signaling code. In response to obtaining the at least one control bit, the method sets 604 a line voltage on a transmission line. As shown, setting the line voltage may include selectively sourcing current 606 via at least one current source to the transmission line to drive a line voltage above a termination voltage $V_T$ of a termination voltage source connected to the transmission line via a termination impedance element Rterm, wherein each current source of the at least one current sources has an output impedance different than a characteristic impedance of the transmission line. In order to drive the line voltage below the termination voltage, the method may selectively sink 608 current via at least one current sink from the transmission line to drive a line voltage below the termination voltage $V_T$, each of the at least one current sinks having an output impedance different than the characteristic impedance of the transmission line.

In some embodiments, the termination impedance element Rterm is matched to the characteristic impedance of the transmission line. In some embodiments, at least one current source or at least one current sink is coupled to the transmission line via a transmit impedance, such as resistors $R_1$ and $R_2$ in FIGS. 1-3. In some embodiments, a current source and a current sink are coupled to the transmission line via a common transmit impedance, as shown in FIGS. 1 and 2, where a tri-state driver 110 is coupled to the transmission line 130 via transmit impedance $R_1$. In some embodiments, selectively sourcing or sinking current comprises enabling one or more switches according to the at least one control bit. Such an embodiment is illustrated by FIG. 3 utilizing switches 330, 340, 350, and 360. In some embodiments, at least one of the current sources is an active current source, such as Idd1 and Idd2 in FIG. 3. In some embodiments, at least one current sink is a passive current sink, illustrated by resistive current sinks $R_1$ and $R_2$ in FIG. 3.

In some embodiments, the method further includes selectively sourcing current to and sinking current from at least a second transmission line connected to the termination voltage source via a second termination impedance element, the current selectively sourced and sunk according to control bits identifying a second symbol of the codeword of the vector signaling code. In such an embodiment, multiple instances of a driver as shown in FIGS. 1-3 may have corresponding transmission lines connected to the termination voltage source providing $V_T$ via a respective termination impedance element $R_{term}$. Such an embodiment utilizing a multi-transmission line system is shown in FIG. 5. In some embodiments, the method further includes switching a single current source or current sink between the transmission line and the second transmission line. A switching circuit as illustrated by FIG. 4 may provide such a switching function, in which a reduced number of current sources are used and switched between each transmission line of the plurality of transmission lines. In some embodiments, the line voltage is set to one of at least three possible values.

Example signal levels, signal frequencies, and physical dimensions described herein are provided for purposes of explanation, and are not limiting. Different vector signaling codes may be used, communicated using more or fewer wires per group, fewer or greater numbers of signal levels per wire, and/or with different code word constraints. For convenience, signal levels are described herein as voltages, rather than their equivalent current values.

Other embodiments may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with some embodiments.

The examples presented herein illustrate the use of vector signaling codes carried by parallel transmission line interconnections for intra-chip and chip-to-chip communication. However, those exemplary details should not been seen as limiting the scope of the described embodiments. The methods disclosed in this application are equally applicable to other interconnection topologies and other communication media including optical, capacitive, inductive, and wireless communications which may rely on any of the characteristics of the described embodiments, including but not limited to communications protocol, signaling methods, and physical interface characteristics. Thus, descriptive terms such as "voltage" or "signal level" should be considered to include equivalents in other measurement systems, such as "current", "optical intensity", "RF modulation", etc. As used herein, the term "signal" includes any suitable behavior and/or attribute of a physical phenomenon capable of conveying information. The information conveyed by such signals may be tangible and non-transitory.

We claim:

1. An apparatus comprising:
a voltage termination node connected to a plurality of transmission lines via a plurality of termination impedance elements, the voltage termination node having a termination voltage corresponding to a summation of a plurality of currents flowing through the plurality of termination impedance elements, each current of the plurality of currents corresponding to a respective symbol of a plurality of symbols of a balanced codeword of a vector signaling code, each symbol of the plurality of symbols of the balanced codeword having a symbol value selected from a set of at least three symbol values;
a plurality of multi-level drivers, each multi-level driver connected to a respective transmission line of the plurality of transmission lines and to the voltage termination node via a respective termination impedance element of the plurality of termination impedance elements, each multi-level driver configured to generate a corresponding current of the plurality of currents, each multi-level driver comprising:
at least one current source connected to the respective transmission line, each current source selectively enabled to source current to the respective transmission line to drive a line voltage above the termination voltage of the termination voltage node connected to the transmission line via the respective termination impedance element of the plurality of termination impedance elements, wherein each of the at least one current sources has an output impedance different than a characteristic impedance of the transmission line; and
at least one current sink connected to the respective transmission line, each current sink selectively enabled to sink current from the transmission line to drive a line voltage below the termination voltage, each of the at least one current sinks having an output impedance different than the characteristic impedance of the transmission line.

2. The apparatus of claim 1, wherein the termination impedance is matched to the characteristic impedance of the respective transmission line.

3. The apparatus of claim 1, wherein each multi-level driver further comprises at least one transmit impedance element connecting at least one current source or at least one current sink to the respective transmission line.

4. The apparatus of claim 1, wherein each current source and current sink comprises a corresponding switch configured to selectively enable sourcing or sinking of the current to the respective transmission line.

5. The apparatus of claim 4, wherein at least one of the current sources is an active current source connected to the respective transmission line via the corresponding switch.

6. The apparatus of claim 1, wherein at least one current sink is a resistive element connected to the respective transmission line.

7. The apparatus of claim 1, further comprising a switching circuit connected to a single current source or a current sink, the switching circuit configured to connect the single current source or current sink to one or more transmission lines of the plurality of transmission lines.

8. The apparatus of claim 1, wherein the voltage termination node comprises a capacitor configured to maintain the termination voltage.

9. A method comprising:
obtaining a plurality of control bits identifying a plurality of symbols of a balanced codeword of a vector signaling code, each symbol of the plurality of symbols of the balanced codeword having a symbol value selected from a set of at least three symbol values;
in response to obtaining the plurality of control bits, setting a line voltage on a plurality of transmission lines connected to a voltage termination node via a plurality of termination impedance elements, the voltage termination node having a termination voltage corresponding to a summation of a plurality of currents flowing through the plurality of termination impedance elements, each current of the plurality of currents corresponding to a respective symbol of the plurality of symbols of the balanced codeword, wherein setting the line voltage on each respective transmission line of the plurality of transmission lines comprises:
selectively sourcing current via at least one current source to the respective transmission line to drive the line voltage above the termination voltage of the termination voltage node connected to the respective transmission line via a respective termination impedance element of the plurality of termination impedance elements, wherein each of the at least one current sources has an output impedance different than a characteristic impedance of the transmission line; and
selectively sinking current via at least one current sink from the respective transmission line to drive the line voltage below the termination voltage, each of the at least one current sinks having an output impedance different than the characteristic impedance of the respective transmission line.

10. The method of claim 9, wherein the termination impedance element is matched to the characteristic impedance of the respective transmission line.

11. The method of claim 9, wherein at least one current source or at least one current sink is coupled to the respective transmission line via a transmit impedance.

12. The method of claim 9, wherein selectively sourcing or sinking current comprises enabling one or more switches according to the plurality of control bits.

13. The method of claim 9, wherein at least one of the current sources is an active current source.

14. The method of claim 9, wherein at least one current sink is a passive current sink.

15. The method of claim 9 further comprising switching a single current source or current sink between one or more transmission lines of the plurality of transmission lines.

16. The method of claim 9, wherein the termination voltage is maintained by charging and discharging a capacitor connected to the voltage termination node according to the plurality of currents.

* * * * *